United States Patent
Lee

(10) Patent No.: US 8,400,589 B2
(45) Date of Patent: Mar. 19, 2013

(54) FLAT PANEL DISPLAY DEVICE AND METHOD OF MANUFACTURING THE SAME

(75) Inventor: Yul-Kyu Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 335 days.

(21) Appl. No.: 12/792,639

(22) Filed: Jun. 2, 2010

(65) Prior Publication Data

US 2011/0090438 A1   Apr. 21, 2011

(30) Foreign Application Priority Data

Oct. 21, 2009   (KR) ........................ 10-2009-0100197

(51) Int. Cl.
*G02F 1/1333* (2006.01)
(52) U.S. Cl. .......................... 349/110; 349/43
(58) Field of Classification Search ................ 349/138, 349/43, 38, 110, 69; 438/34; 257/E33.001
See application file for complete search history.

(56) References Cited

U.S. PATENT DOCUMENTS

| | | | |
|---|---|---|---|
| 5,844,647 A * | 12/1998 | Maruno et al. ................ | 349/110 |
| 6,356,318 B1 | 3/2002 | Kawahata | |
| 6,953,949 B2 | 10/2005 | Murade | |
| 7,202,115 B2 * | 4/2007 | Hirano et al. ................ | 438/149 |
| 7,335,917 B2 * | 2/2008 | Koo et al. ....................... | 257/72 |
| 7,619,695 B2 | 11/2009 | Nomura et al. | |
| 7,652,291 B2 | 1/2010 | Koo et al. | |
| 7,839,462 B2 | 11/2010 | Lin | |
| 2005/0189535 A1 | 9/2005 | Hsueh et al. | |
| 2007/0170845 A1 | 7/2007 | Choi et al. | |
| 2007/0273800 A1 | 11/2007 | Nomura et al. | |
| 2010/0062553 A1 | 3/2010 | Sung et al. | |
| 2010/0117073 A1 | 5/2010 | Yamazaki et al. | |
| 2012/0007083 A1 | 1/2012 | You et al. | |
| 2012/0080663 A1 | 4/2012 | Lee et al. | |

FOREIGN PATENT DOCUMENTS

| | | |
|---|---|---|
| CN | 101354513 A | 1/2009 |
| EP | 2 023 194 A1 | 2/2009 |
| JP | 2000-091585 A | 3/2000 |
| JP | 2001-242803 A | 9/2001 |
| JP | 2005-031251 A | 2/2005 |
| JP | 2005-209583 A | 8/2005 |
| JP | 2009-076890 A | 4/2009 |
| KR | 10-2004-0055223 A | 6/2004 |
| KR | 10-0482328 B1 | 3/2005 |

(Continued)

OTHER PUBLICATIONS

Korean Office Action dated Nov. 30, 2011 for Korean Patent Application No. KR 10-2009-0121773 corresponding to U.S. Appl. No. 12/957,233, filed Nov. 30, 2010.

(Continued)

*Primary Examiner* — Thoi Duong
(74) *Attorney, Agent, or Firm* — Knobbe, Martens, Olson & Bear LLP

(57) ABSTRACT

A flat panel display device and a method of manufacturing the same are disclosed. In one embodiment, a flat panel display device includes a substrate having a thin film transistor (TFT) formed thereon, and a blocking layer is formed between the TFT and the substrate. The blocking layer is disposed only in the region vertically corresponding to an active layer of the TFT. Thus, light transmittance is not reduced, and accordingly, there is generally better luminance and image quality of the device.

16 Claims, 5 Drawing Sheets

FOREIGN PATENT DOCUMENTS

| | | | |
|---|---|---|---|
| KR | 10-2005-0072700 A | 7/2005 |
| KR | 10-2006-0078581 A | 7/2006 |
| KR | 10-0674238 B1 | 1/2007 |
| KR | 10-2007-0025151 A | 3/2007 |
| KR | 10-0708722 B1 | 4/2007 |
| KR | 10-2007-0115355 A | 12/2007 |
| KR | 10-2008-0097056 A | 11/2008 |
| KR | 10-0867926 B1 | 11/2008 |
| KR | 10-2009-0116131 A | 11/2009 |

OTHER PUBLICATIONS

Chinese Office Action dated Mar. 27, 2012 for Chinese Patent Application No. CN 201010222035.1 which shares priority of Korean Patent Application No. KR 10-2009-0100197.

Japanese Office Action dated Jun. 5, 2012 for Japanese Patent Application No. JP 2010-108551 corresponding to Korean Patent Application No. KR 10-2009-0100197.

Korean Office Action dated Jun. 28, 2011 for Korean Patent Application No. KR 10-2009-0117878 corresponding to U.S. Appl. No. 12/957,246, filed Nov. 30, 2010.

Korean Office Action dated Jul. 29, 2011 for Korean Patent Application No. KR 10-2009-0100197.

Korean Office Action dated Mar. 21, 2011 for Korean Patent Application No. KR 10-2009-0117878 corresponding to U.S. Appl. No. 12/957,246, filed Nov. 30, 2010.

Korean Office Action dated Mar. 21, 2011 for Korean Patent Application No. KR 10-2009-0121773 corresponding to U.S. Appl. No. 12/957,233, filed Nov. 30, 2010.

Notice of Allowance dated Nov. 5, 2012 for U.S. Appl. No. 12/957,233, filed Nov. 30, 2010, which is related to captioned U.S. Appl. No. 12/792,639.

Notice of Allowance dated Nov. 14, 2012 for U.S. Appl. No. 12/957,246, filed Nov. 30, 2010, which is related to captioned U.S. Appl. No. 12/792,639.

* cited by examiner

FLAT PANEL DISPLAY DEVICE AND METHOD OF MANUFACTURING THE SAME

CROSS-REFERENCE TO RELATED APPLICATIONS

This application claims priority to and the benefit of Korean Patent Application No. 10-2009-0100197, filed on Oct. 21, 2009, in the Korean Intellectual Property Office, the entire content of which is incorporated herein by reference.

BACKGROUND

1. Field

An aspect of the present invention relates to a flat panel display device and a method of manufacturing the same, and more particularly, to a flat panel display device capable of displaying images and a method of manufacturing the same.

2. Description of the Related Technology

Flat panel display devices, such as liquid crystal display devices using electro-optical characteristics of liquid crystals and organic light emitting display devices using self-emission characteristics of organic light emitting diodes, are divided into a passive matrix type and an active matrix type. The active matrix type including thin film transistors has an excellent resolution and moving picture implementation capability. Hence, the active matrix type is frequently used as compared with the passive matrix type.

An active matrix type liquid crystal display device (TFT-LCD) includes a display panel having liquid crystals injected between two substrates, a back light used as a light source positioned at the rear of the display panel, and a drive integrated circuit (IC) for driving the display panel. Light generated from the back light is incident onto the display panel, modulated by liquid crystals oriented in accordance with signals generated from the drive IC and then emitted to the exterior of the display panel, thereby displaying characters or images.

SUMMARY OF CERTAIN INVENTIVE ASPECTS

One aspect is a flat panel display device having an improved light transmittance and a method of manufacturing the same.

Another aspect is a flat panel display device including a first substrate; a thin film transistor (TFT) formed on the first substrate; a blocking layer formed to vertically correspond to the TFT between the first substrate and the TFT; a planarization layer formed on the first substrate having the TFT, the planarization layer having a via hole formed therein so that a source or drain electrode of the TFT is exposed through the via hole; a pixel electrode formed on the planarization layer to be connected to the source or drain electrode; a second substrate disposed opposite to the first substrate; a common electrode formed on the second substrate; and a liquid crystal layer injected between the first and second substrates.

Another aspect is a flat panel display device including a TFT formed on the first substrate; a blocking layer formed to vertically correspond to the TFT between the first substrate and the TFT; a planarization layer formed on the first substrate having the TFT, the planarization layer having a via hole formed therein so that a source or drain electrode of the TFT is exposed through the via hole; a pixel electrode formed on the planarization layer to be connected to the source or drain electrode; an organic light emitting layer formed on the pixel electrode; and a cathode electrode formed on the organic light emitting layer.

Another aspect is a method of manufacturing a flat panel display device, which includes providing a substrate having a pixel region and an element forming region; forming a blocking layer on the substrate having the pixel region and the element forming region; forming an active layer on the blocking layer in the element forming region; removing a portion exposed to a side of the active layer in the blocking layer so that the blocking layer is disposed only beneath the active layer; forming a gate insulating layer on the substrate having the active layer; forming a gate electrode on the gate insulating layer above the active layer; forming an interlayer dielectric layer on the gate insulating layer having the gate electrode and then exposing a portion of the active layer; forming source and drain electrodes to be connected to the active layer on the interlayer dielectric layer; forming a planarization layer on the interlayer dielectric layer having the source and drain electrodes and then exposing the source or drain electrode; and forming a pixel electrode to be connected to the source or drain electrode on the planarization layer having the pixel region.

The method may further include forming a pixel defining layer on the planarization layer having the pixel electrode; patterning the pixel defining layer to expose the pixel electrode in a light emitting region; forming an organic light emitting layer on the exposed pixel electrode; and forming a cathode electrode on the organic light emitting layer.

The active layer of the TFT applied to the flat panel display device may be formed of a semiconductor such as poly silicon. The semiconductor may have conductivity changed by impurities diffused from the substrate. A blocking layer may be formed of an inorganic material beneath the TFT. The blocking layer may not be formed in the pixel region to which light is transmitted but formed only in the element forming region having the TFT. Another aspect is a flat panel display device comprising: a first substrate; a second substrate disposed opposite to the first substrate; a common electrode formed between the first and second substrates, wherein the common electrode is closer to the second substrate than the first substrate; a liquid crystal layer formed between the first and second substrates; a thin film transistor (TFT) formed between the first and second substrates, wherein the TFT comprises source and drain electrodes; a blocking layer formed between the first substrate and the TFT, wherein the blocking layer is formed only beneath the TFT; a planarization layer formed on the TFT, wherein a via hole is defined in the planarization layer; and a pixel electrode formed on the planarization layer and electrically connected to the source or drain electrode of the TFT through the via hole.

In the above device, the blocking layer comprises a first sub-blocking layer and a second sub-blocking layer formed on the first sub-blocking layer, and wherein the first blocking layer is thinner and closer to the first substrate than the second sub-blocking layer. In the above device, the first sub-blocking layer is formed of silicon oxide, and wherein the second sub-blocking layer is formed of silicon nitride.

In the above device, the TFT comprises: an active layer formed on the blocking layer, wherein the active layer comprises source, drain and channel regions, and wherein the blocking layer is formed only beneath the active layer; a gate insulating layer formed on the active layer; a gate electrode formed on the gate insulating layer in the channel region; an interlayer dielectric layer formed on the gate electrode and the gate insulating layer, wherein a contact hole is defined in the interlayer dielectric layer; and source and drain electrodes formed on the interlayer dielectric layer, wherein the source and drain electrodes are electrically connected to the active layer through the contact hole.

In the above device, the blocking layer is formed between and contacts the first substrate and the active layer. In the above device, the blocking layer is formed between and contacts the first substrate and the active layer, wherein the blocking layer has a first width defined along a first direction, and wherein the active layer has a second width defined along the first direction, and wherein the first width and the second width are substantially the same. In the above device, the active layer is formed of poly silicon. The above device further comprises gate and data lines arranged in a matrix form over the first substrate, wherein the gate and data lines are electrically connected to the TFT.

Another aspect is a flat panel display device comprising: a substrate, wherein a pixel region and an element forming region are formed in or over the substrate, and wherein the pixel region is configured to emit light; a thin film transistor (TFT) formed over the substrate, wherein the TFT comprises source and drain electrodes; a first blocking layer formed between the first substrate and the TFT, wherein the blocking layer is not formed in the pixel region; a planarization layer formed on the TFT, wherein a via hole is defined in the planarization layer; a pixel electrode formed on the planarization layer and electrically connected to the source or drain electrode of the TFT through the via hole; an organic light emitting layer formed on the pixel electrode; and a cathode electrode formed on the organic light emitting layer.

In the above device, the first blocking layer comprises a silicon oxide layer and a silicon nitride layer formed on the silicon oxide layer, and wherein the silicon oxide layer is closer to the substrate than the silicon nitride layer. In the above device, the TFT comprises: an active layer formed on the first blocking layer, wherein the active layer comprises source, drain and channel regions and wherein the blocking layer is formed only beneath the active layer; a gate insulating layer formed on the active layer; a gate electrode formed on the gate insulating layer in the channel region; an interlayer dielectric layer formed on the gate electrode and gate insulating layer, wherein a contact hole is defined in the interlayer dielectric layer; and source and drain electrodes formed on the interlayer dielectric layer and electrically connected to the active layer in the source and drain regions through the contact hole.

In the above device, the first blocking layer is formed between the substrate and the active layer, wherein the first blocking layer has a first width defined along a first direction, wherein the active layer has a second width defined along the first direction, and wherein the first width and the second width are substantially the same. The above device further comprises: a capacitor formed between the substrate and the interlayer dielectric layer, wherein the capacitor is formed adjacent to the TFT, and wherein the capacitor comprises a lower electrode and an upper electrode; and a second blocking layer formed between and contacting the substrate and the lower electrode of the capacitor, wherein the second blocking layer is formed only beneath the lower electrode of the capacitor. In the above device, the second blocking layer comprises a silicon oxide layer and a silicon nitride layer formed on the silicon oxide layer, and wherein the silicon oxide layer is closer to the substrate than the silicon nitride layer.

Another aspect is a method of manufacturing a flat panel display device, comprising: providing a substrate, wherein a pixel region and an element forming region are formed in and over the substrate; forming at least one blocking layer in the element forming region of the substrate; forming an active layer on the blocking layer in the element forming region; removing portions of the active layer and the at least one blocking layer so that the blocking layer is disposed only beneath the active layer; forming a gate insulating layer on the substrate and the active layer; forming a gate electrode on the gate insulating layer; forming an interlayer dielectric layer on the gate insulating layer and the gate electrode; exposing a portion of the active layer; forming source and drain electrodes on the interlayer dielectric layer so as to be electrically connected to the exposed portion of the active layer; forming a planarization layer on i) the interlayer dielectric layer and ii) the source and drain electrodes; exposing the source or drain electrode; and forming a pixel electrode on the planarization layer so as to be electrically connected to the exposed portion of the source or drain electrode.

In the above method, the at least one blocking layer comprises a plurality of blocking layers which are separated from each other and are not formed in the pixel region. In the above method, forming the at least one blocking layer comprises: forming a silicon oxide layer on the substrate; and forming a silicon nitride layer on the silicon oxide layer, wherein the silicon oxide layer and the silicon nitride layer have substantially the same width.

In the above method, the removing of the blocking layer is performed by dry etching. In the above method, the dry etching is an inductively coupled plasma etching. The above method further comprises: forming a pixel defining layer on the planarization layer and the pixel electrode; patterning the pixel defining layer to expose the pixel electrode in a light emitting region; forming an organic light emitting layer on the exposed pixel electrode; and forming a cathode electrode on the organic light emitting layer.

DETAILED DESCRIPTION OF CERTAIN INVENTIVE EMBODIMENTS

Figure 1:
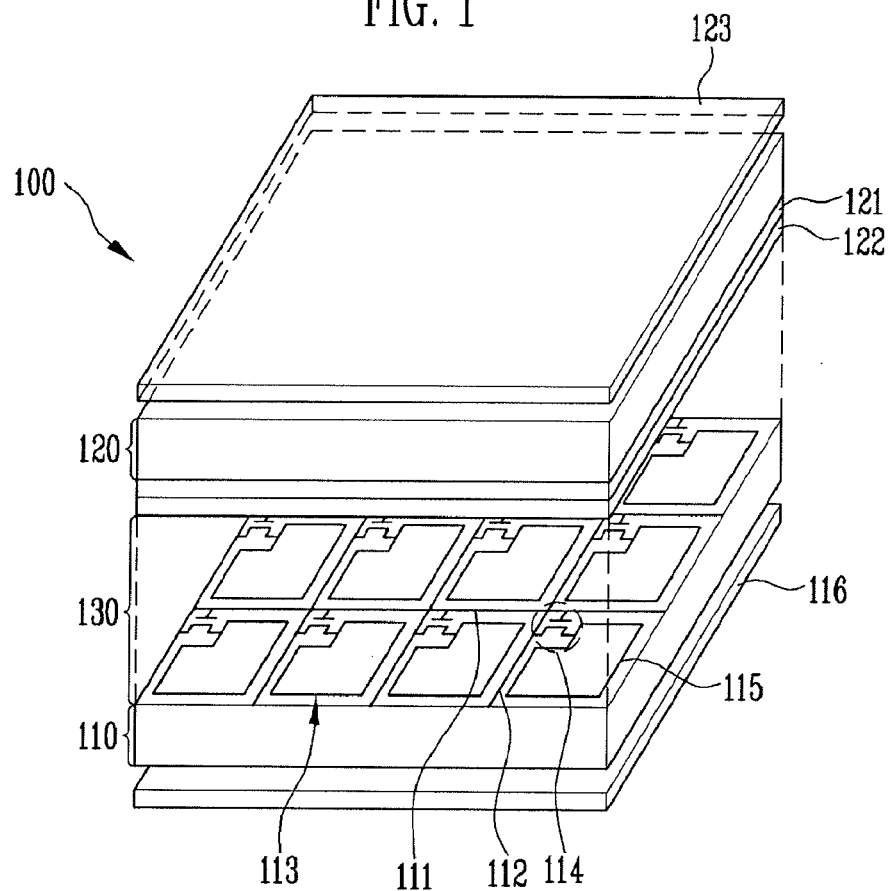
FIG. 1 is a perspective view of a flat panel display device according to an embodiment of the present invention.

An active matrix type organic light emitting display device includes a display panel having organic light emitting diodes formed therein and drive IC for driving the display panel. Light generated from the organic light emitting diodes is emitted to the exterior of the display panel in accordance with signals generated from the drive IC, thereby displaying characters or images.

Thus, in flat panel display devices such as liquid crystal display devices and organic light emitting display devices, light transmittance in a display panel has much influence on luminance.

However, since an active matrix type flat panel display device includes thin film transistors, insulating layers such as a silicon oxide and a nitride oxide are formed into a stacked structure on a substrate in a pixel region into which light is transmitted in the manufacturing process. Therefore, light transmittance is lowered by the insulating layers, and luminance is decreased.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

FIG. 1 is a perspective view of a flat panel display device according to an embodiment of the present invention. A display panel for displaying images will be schematically described.

In one embodiment, the display panel 100 includes two substrates 110 and 120 disposed opposite to each other and a liquid crystal layer 130 interposed between the two substrates 110 and 120.

Pixel regions 113 are defined by a plurality of gate lines 111 and a plurality of data lines 112, arranged in a matrix form, on the substrate 110. A thin film transistor (TFT) 114 for controlling a signal supplied to each pixel and a pixel electrode 115 connected to the TFT 114 may be formed at each intersection portion of the gate and data lines 111 and 112 on the substrate 110. A capacitor (not shown) for maintaining a signal may be connected to the TFT 114.

A color filter 121 and a common electrode 122 may be formed on the substrate 120. Polarizing plates 116 and 123 may be formed at the rears of the substrates 110 and 120, respectively. A back light (not shown) may be disposed as a light source beneath the polarizing plate 116.

An LCD drive IC (not shown) may be mounted on the display panel 100. The LCD drive IC converts electrical signals supplied from the exterior thereof into scan and data signals, and supplies the scan and data signals to the gate and data lines, respectively.

Figure 2:
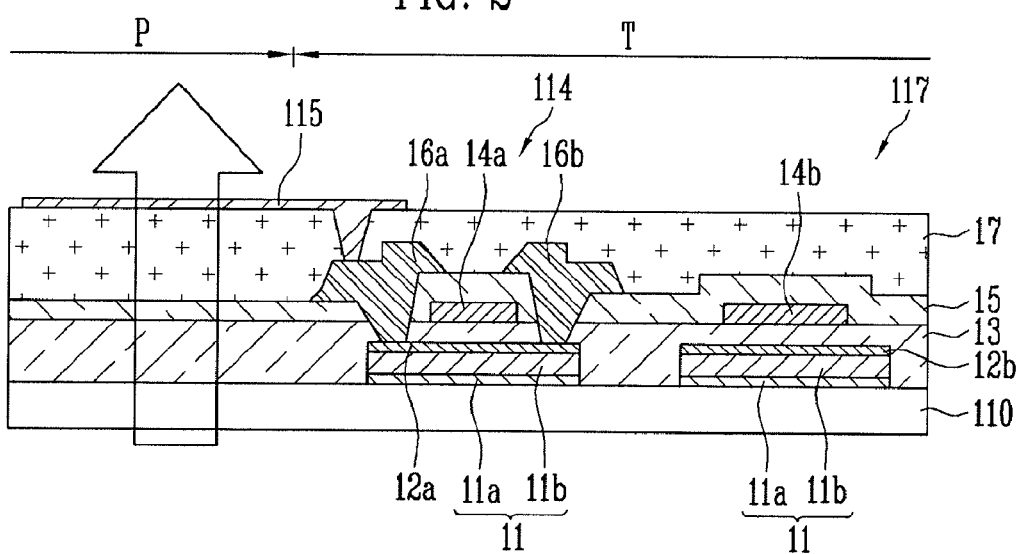
FIGS. 2 and 5 are sectional views illustrating a pixel region and a thin film transistor (TFT), shown in FIG. 1.

FIG. 2 is a sectional view more specifically illustrating the pixel region 113 and the TFT 114, illustrated in FIG. 1. A capacitor 117 connected to the TFT 114 is further illustrated in FIG. 2.

The substrate 110 may include a pixel region P and an element forming region T. A blocking layer 11 may be formed on the substrate 110 in the element forming region T, and the TFT 114 and the capacitor 117 may be formed on the blocking layer 11.

In one embodiment, the TFT 114 includes i) an active layer 12a, ii) a gate insulating layer 13, iii) a gate electrode 14a, iv) an insulating dielectric layer 15 and v) source and drain electrodes 16a and 16b. The active layer 12a may be formed on the blocking layer 11 to substantially vertically correspond to the blocking layer 11, and may have source, drain and channel regions. The gate insulating layer 13 may be formed on the active layer 12a. The gate electrode 14a may be formed on the gate insulating layer 13 in the channel region. The insulating dielectric layer 15 may be formed on i) the gate electrode 14a, ii) gate insulating layer 13 and iii) an upper electrode 14b. The insulating dielectric layer 15 may have a contact hole formed so that the active layer 12a in the source and drain regions is exposed therethrough. The source and drain electrodes 16a and 16b may be formed on the interlayer dielectric layer 15, and may be connected to the active layer 12a in the source and drain regions through the contact hole.

Here, the blocking layer 11 may be selectively disposed only beneath the active layer 12a. In one embodiment, as shown in FIG. 2, the blocking layer 11 substantially vertically corresponds to the active layer 12a, and the upper surface of the blocking layer 11 is substantially completely covered by the active layer 12a.

The capacitor 117 may be formed into a metal-insulator-semiconductor (MIS) structure including a lower electrode 12b, a gate insulating layer 13 and an upper electrode 14b, formed on the blocking layer 11.

The blocking layer 11 may be selectively disposed only beneath the active layer 12a. That is, the blocking layer 11 substantially vertically corresponds to the lower electrode 12b, and the upper surface of the blocking layer 11 may be substantially completely covered by the lower electrode 12b.

A planarization layer 17 may be formed over the substrate 110 in the pixel region P and the element forming region T in which the TFT 114 and the capacitor 117 are formed as described above. A via hole may be formed in the planarization layer 17 so that the source or drain electrode 16a or 16b are exposed therethrough. The pixel electrode 115 may be formed on the planarization layer 17 and the pixel region P so as to be connected to the source or drain electrode 16a or 16b through the via hole.

Figure 3:
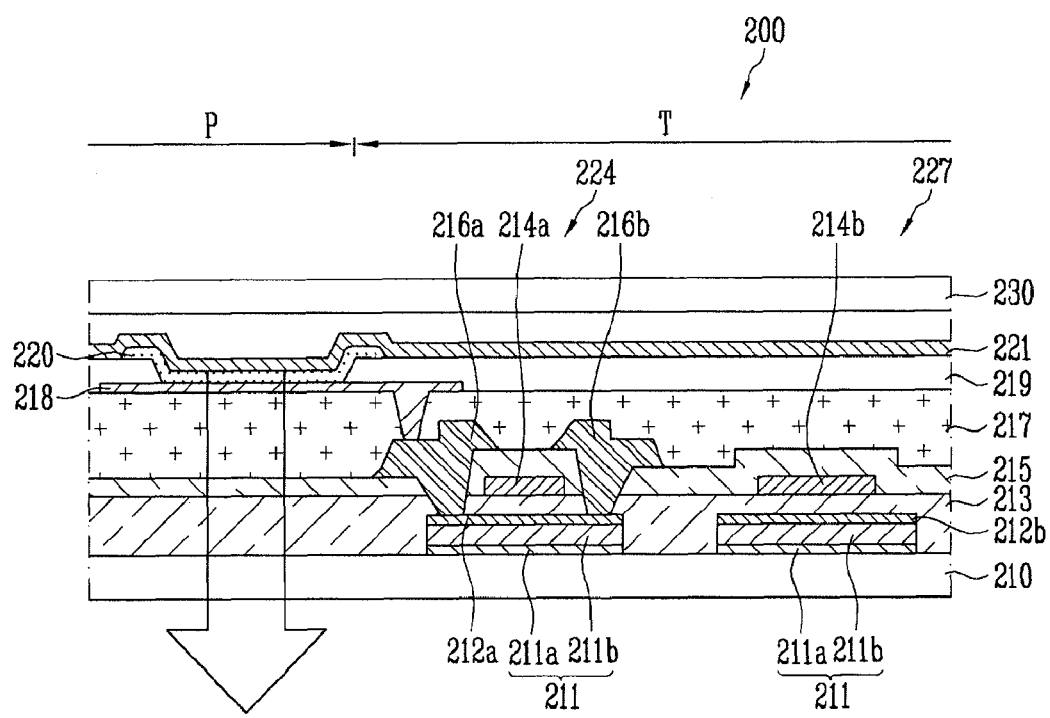
FIG. 3 is a sectional view of a flat panel display device according to another embodiment of the present invention.

FIG. 3 is a sectional view of a flat panel display device according to another embodiment of the present invention. A display panel 200 for displaying images will be schematically described.

In one embodiment, as shown in FIG. 3, a substrate 210 includes a pixel region P and an element forming region T. A blocking layer 211 may be formed on the substrate 210 in the element forming region T, and a TFT 224 and a capacitor 227 may be formed on the blocking layer 211.

The TFT 224 may include i) an active layer 212a, ii) a gate insulating layer 213, iii) a gate electrode 214a, iv) an insulating dielectric layer 215 and v) source and drain electrodes 216a and 216b. The active layer 212a may be formed on the blocking layer 211 to substantially vertically correspond to the blocking layer 211, and may have source, drain and channel regions. The gate insulating layer 213 may be formed on the active layer 212a. The gate electrode 214a may be formed on the gate insulating layer 213 in the channel region. The insulating dielectric layer 215 may be formed on i) the gate electrode 14a, ii) gate insulating layer 13 and iii) an upper electrode 14b. The insulating dielectric layer 215 may have a contact hole formed so that the active layer 212a in the source and drain regions is exposed therethrough. The source and drain electrodes 216a and 216b may be formed on the interlayer dielectric layer 215, and may be connected to the active layer 212a in the source and drain regions through the contact hole.

The capacitor 227 may be formed into an MIS structure including a lower electrode 212b, the gate insulating layer 213 and an upper electrode 214b, formed on the blocking layer 11.

A planarization layer 217 may be formed over the substrate 210 in the pixel region P and the element forming region T in which the TFT 224 and the capacitor 227 are formed as described above. A via hole may be formed in the planarization layer 217 so that the source or drain electrode 216a or 216b are exposed therethrough. A pixel electrode 218 may be formed on the planarization layer 217 and the pixel region P so as to be connected to the source or drain electrode 216a or 216b through the via hole.

A pixel defining layer 219 may be formed on the planarization layer 217 including the pixel electrode 218 so that the pixel electrode 218 is exposed, and an organic light emitting layer 220 may be formed on the exposed pixel electrode 218. A cathode electrode 221 may be formed on the pixel defining layer 219 and the organic light emitting layer 220.

A sealing substrate 230 may be disposed above the lower substrate 210 configured as described above, and the lower substrate 210 and the sealing substrate 230 may be joined together and sealed by a sealing member (not shown).

Hereinafter, a method of manufacturing a flat panel display device configured as described above will be described in a more detailed manner.

FIGS. 4A to 4E are sectional views illustrating a method of manufacturing a flat panel display device according to an embodiment of the present invention.

Figure 4A:
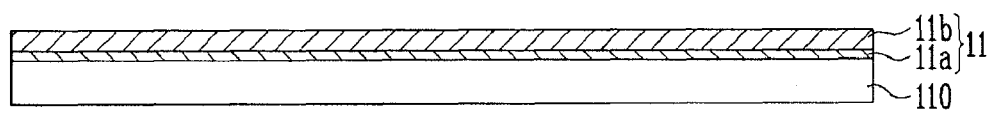
FIGS. 4A to 4E are sectional views illustrating a method of manufacturing a flat panel display device according to an embodiment of the present invention.

Referring to FIG. 4A, a transparent substrate 110 such as glass or plastic is prepared. The substrate 110 includes a pixel region P and an element forming region T. First, a blocking layer 11 is formed on the substrate 110 in the pixel region T and the element forming region T. In one embodiment, the blocking layer 11 prevents an active layer from being contaminated due to diffusion of impurities and controls a degree of crystallization of the active layer in a crystallizing process. Therefore, the blocking layer 11 may be formed into a stacked structure of i) a first sub-blocking layer such as a silicon oxide ($SiO_2$) 11a and ii) a second sub-blocking layer such as a silicon nitride ($SiN_x$) 11b so as to effectively prevent diffusion of impurities and to equalize the degree of crystallization of the active layer.

Figure 4B:
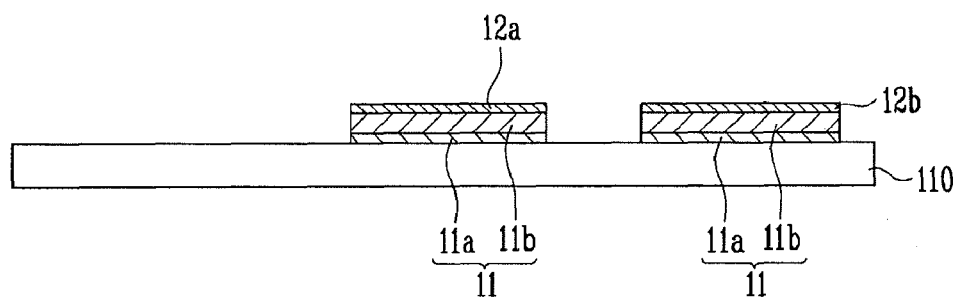

Referring to FIG. 4B, an active layer 12a and a lower electrode 12b of a capacitor are formed on the substrate 110 in the element forming region T. Here, the active layer 12a includes source, drain and channel regions of a TFT. In one embodiment, the active layer 12a and the lower electrode 12b are formed of a semiconductor such as poly silicon. Crystallization and ion implantation may be performed with respect to the active layer 12a and the lower electrode 12b. Side portions of the active layer 12a and the lower electrode 12b, i.e., exposed portions of the blocking layer 11 may be removed by dry etch. The dry etch may be performed using inductively coupled plasma etch which can minimize damage of the active layer 12a and maintain the profile of side walls to be satisfactory.

In one embodiment, as shown in FIG. 4B, the blocking layer 11 is selectively disposed only beneath the active layer 12a and the lower electrode 12b.

Figure 4C:
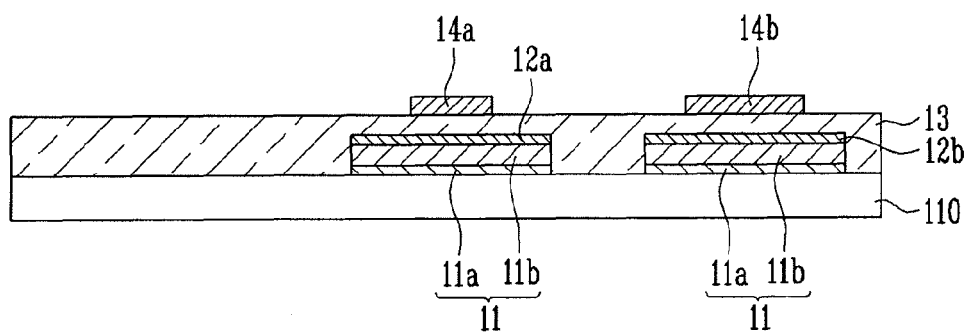

Referring to FIG. 4C, a gate insulating layer 13 is formed on i) the substrate 110, ii) the active layer 12a and iii) the lower electrode 12b. Then, a gate electrode 14a is formed on the gate insulating layer 13 above the active layer 12a, and an upper electrode 14b is formed on the gate insulating layer 13 above the lower electrode 12b. Gate lines 111 or data lines 112 may be formed in the process of forming the gate electrode 14a and the upper electrode 14b.

Figure 4D:
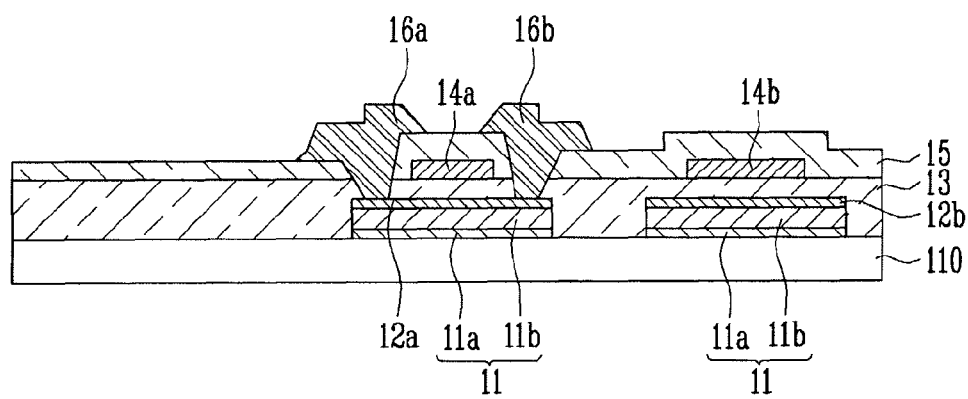

Referring to FIG. 4D, an interlayer dielectric layer 15 is formed on i) the gate insulating layer 13, ii) the gate electrode 14a and iii) the upper electrode 14b, and a contact hole is formed in the interlayer dielectric layer 15 so that the active layer 12a in the source and drain regions is exposed therethrough. Then, source and drain electrodes 16a and 16b are formed so as to be connected to the active layer 12a in the source and drain regions through the contact hole. The gate lines 112 or data lines 114 (see FIG. 1) may be formed in the process of forming the source and drain electrodes 16a and 16b.

Figure 4E:
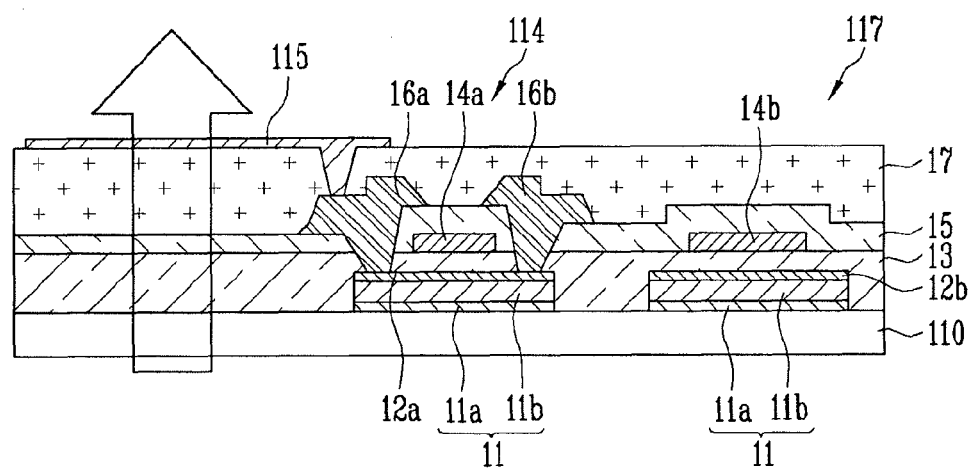

Referring to FIG. 4E, a planarization layer 17 is formed on i) the interlayer dielectric layer 15 and ii) the source and drain electrodes 16a and 16b. A via hole is formed in the planarization layer 17 so that the source and drain electrodes 16a and 16b are exposed therethrough. Then, a pixel electrode 115 is formed on the planarization layer 17 and the pixel region P so as to be connected to the source or drain electrode 16a or 16b through the via hole. The pixel electrode 115 may be formed of a transparent electrode material such as indium tin oxide (ITO) or indium zinc oxide (IZO).

Subsequently, a substrate 120 having a common electrode 122 formed thereon is disposed on the substrate. In the state that the substrates 110 and 120 are spaced apart from each other at a predetermined interval by a spacer (not shown), they may be joined together by a sealing member (not shown). Then, a liquid crystal layer 130 is injected between the substrates 110 and 120, thereby completing a display panel 100.

In one embodiment, light generated from a back light disposed at the rear of the substrate 110 is incident into the liquid crystal layer 130 in the pixel region P, modulated by liquid crystals oriented in accordance with voltages applied to the pixel electrode 115 and the common electrode 122 and then emitted to the exterior of the display panel 100 through the substrate 120, thereby displaying characters or images.

Thus, luminance is much influenced by light transmittance of the region to which light is substantially transmitted in the display panel 100, i.e., the pixel region P. In one embodiment, only the gate insulating layer 13, the interlayer dielectric layer 15 and the planarization layer 17 are formed on the substrate 110 in the pixel region P, and hence, light transmittance is hardly lowered.

Figure 5:
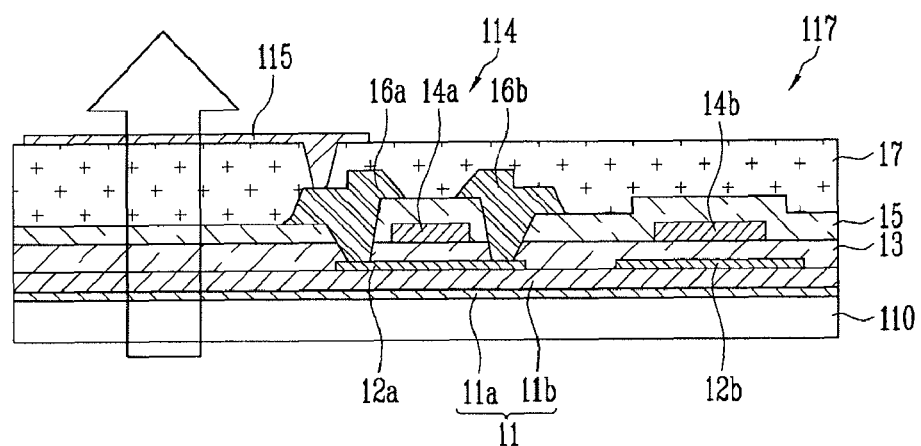

In a comparative example, as shown in FIG. 5, the blocking layer 11 having the stacked structure of the silicon oxide 11a and the silicon nitride 11b is formed on the substrate 110 in the pixel region P and element forming region T. In this comparative example, since the blocking layer 11 blocks the light emitting path in the pixel region p, the transmittance of the silicon nitride 11b is lowered by about 20% than that of the silicon oxide 11a, and oscillation of light is increased. Therefore, light transmittance is lowered.

Figure 6:
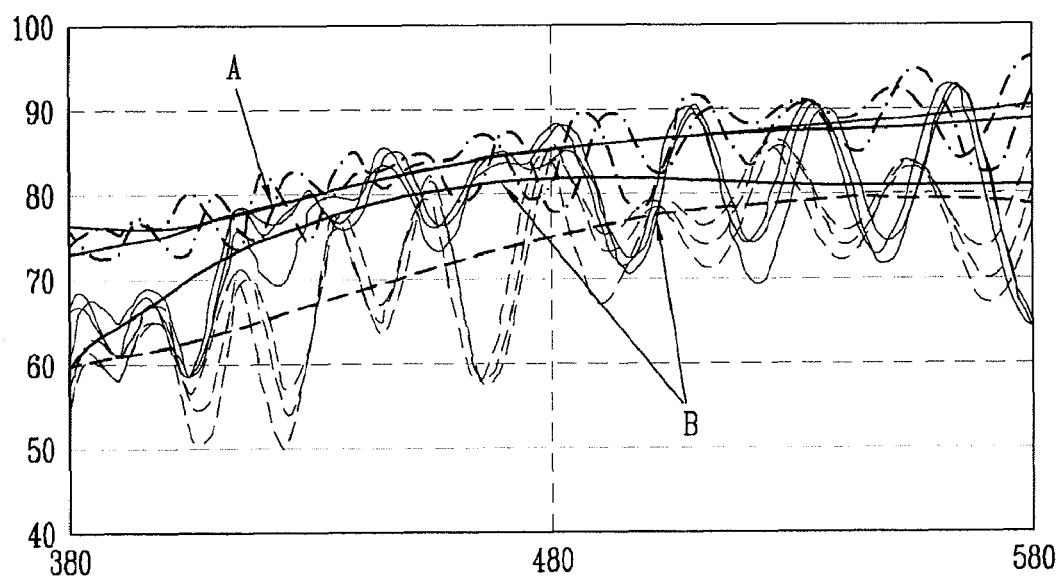
FIG. 6 is a graph illustrating light transmittances of flat panel display devices according to one embodiment of the present invention.

FIG. 6 is a graph illustrating light transmittances of flat panel display devices. It can be seen that the light transmittance (line A) of the flat panel display of FIG. 2 according to one embodiment of the invention is higher by about 20% than that (line B) of the flat panel display of FIG. 5, and oscillation of light is decreased. As shown in FIGS. 2-4, since the blocking layer 11 is formed only in the element forming region T and thus does not block the light emitting path in the pixel region p, light transmittance is not lowered.

Figure 7A:
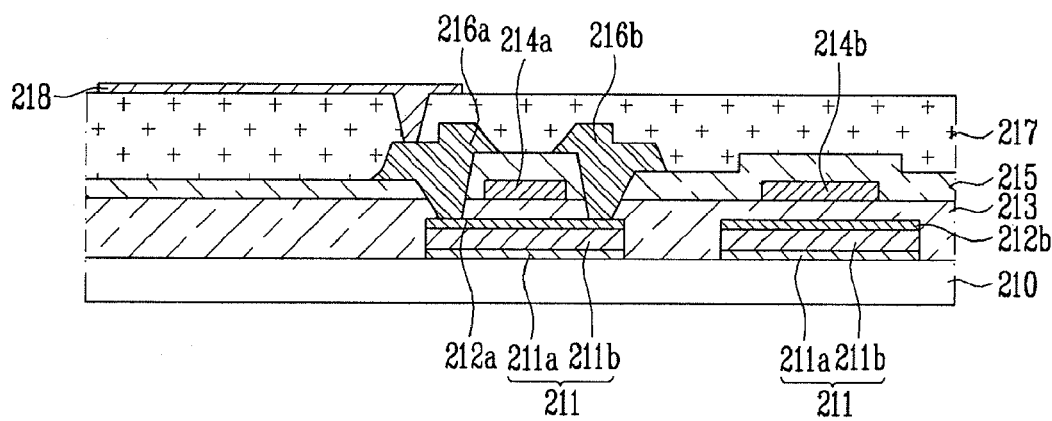
FIGS. 7A and 7B are sectional view illustrating a method of manufacturing a flat panel display device according to another embodiment of the present invention.
Figure 7B:
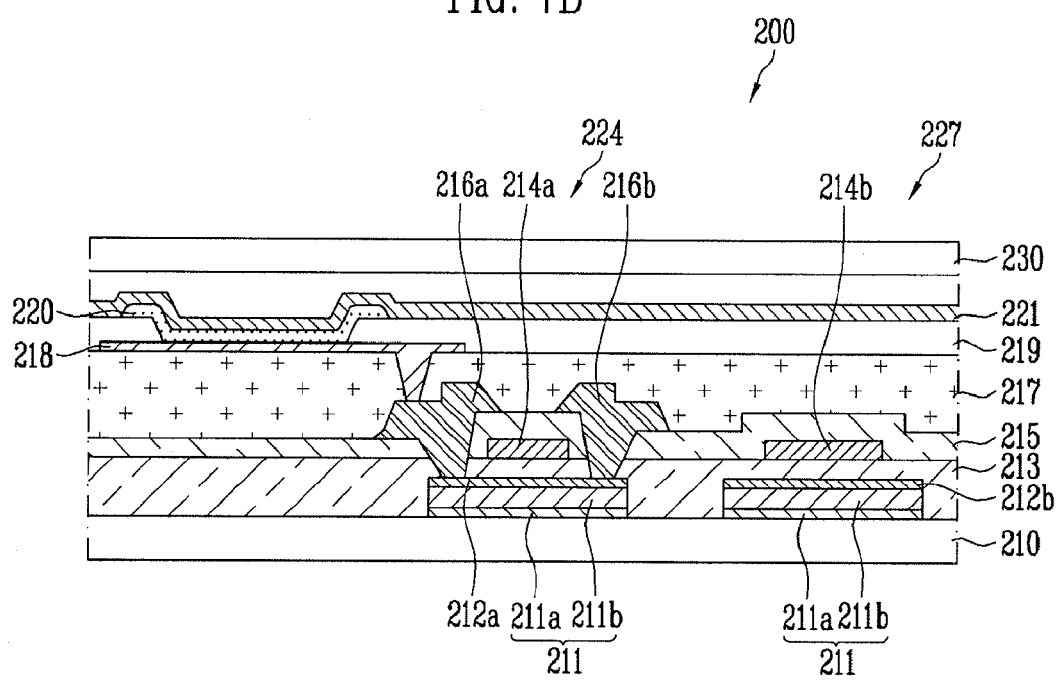

FIGS. 7A and 7B are sectional view illustrating a method of manufacturing a flat panel display device according to another embodiment of the present invention.

Referring to FIG. 7A, a TFT 224 and a capacitor 227 are formed through manufacturing processes identical to those of FIGS. 4A to 4E. Then, a planarization 217 is formed over a lower substrate 210 including the TFT 224 and the capacitor 227, and a pixel electrode 218 is formed to be connected to a source or drain electrode 216a or 216b through a via hole.

Referring to FIG. 7B, a pixel defining layer 219 is formed on the planarization layer 217 and the pixel electrode 218 so that the pixel electrode 218 in a light emitting region is exposed. Then, an organic light emitting layer 220 is formed on the exposed pixel electrode 218, and a cathode electrode 221 is formed on the pixel defining layer 219 including the organic light emitting layer 220.

A sealing substrate 230 is disposed above the lower substrate 210 configured as described above, and the lower substrate 210 and the sealing substrate 230 are joined together by a sealing member.

In the flat panel display device, if a voltage is applied to the pixel electrode 218 and the cathode electrode 221, holes and electrons respectively implanted through the pixel electrode 218 are recombined in the organic light emitting layer 220. Then, light generated from the organic light emitting layer 220 is emitted to the exterior of a display panel 200 through the lower substrate 210 by a difference in energy generated in this procedure, thereby displaying characters or images.

According to one embodiment, luminance is much influenced by light transmittance of the region to which light is substantially transmitted in the display panel 200, i.e., the pixel region P. In one embodiment, only a gate insulating layer 213, an interlayer dielectric layer 215 and the planarization layer 217 are formed on the substrate 210 in the pixel region P, and hence, light transmittance is hardly lowered.

According to at least one embodiment, light transmittance is not lowered by an inorganic material, particularly, a silicon nitride, and accordingly, the luminance and image quality of the flat panel display device can be improved.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flat panel display device comprising:
a first substrate;
a second substrate disposed opposite to the first substrate;
a common electrode formed between the first and second substrates, wherein the common electrode is closer to the second substrate than the first substrate;
a liquid crystal layer formed between the first and second substrates;
a thin film transistor (TFT) formed between the first and second substrates, wherein the TFT comprises source and drain electrodes;
a blocking layer formed between the first substrate and the TFT, wherein the blocking layer is formed only beneath the TFT, wherein the blocking layer comprises a first sub-blocking layer and a second sub-blocking layer formed on the first sub-blocking layer, wherein the first sub-blocking layer is closer to the first substrate than the second sub-blocking layer, and wherein the first sub-blocking layer is formed of silicon oxide, and wherein the second sub-blocking layer is formed of silicon nitride;
a planarization layer formed on the TFT, wherein a via hole is defined in the planarization layer; and
a pixel electrode formed on the planarization layer and electrically connected to the source or drain electrode of the TFT through the via hole.

2. The flat panel display device according to claim 1, wherein the first sub-blocking layer is thinner than the second sub-blocking layer.

3. The flat panel display device according to claim 1, wherein the TFT comprises an active layer formed of poly silicon.

4. The flat panel display device according to claim 1, further comprising gate and data lines arranged in a matrix form over the first substrate, wherein the gate and data lines are electrically connected to the TFT.

5. A flat panel display device comprising:
a first substrate;
a second substrate disposed opposite to the first substrate;
a common electrode formed between the first and second substrates, wherein the common electrode is closer to the second substrate than the first substrate;
a liquid crystal layer formed between the first and second substrates;
a thin film transistor (TFT) formed between the first and second substrates, wherein the TFT comprises source and drain electrodes;
a blocking layer formed between the first substrate and the TFT, wherein the blocking layer is formed only beneath the TFT;
a planarization layer formed on the TFT, wherein a via hole is defined in the planarization layer; and
a pixel electrode formed on the planarization layer and electrically connected to the source or drain electrode of the TFT through the via hole,
wherein the TFT comprises:
an active layer formed on the blocking layer, wherein the active layer comprises source, drain and channel regions, and wherein the blocking layer is formed only beneath the active layer;
a gate insulating layer formed on the active layer;
a gate electrode formed on the gate insulating layer in the channel region;
an interlayer dielectric layer formed on the gate electrode and the gate insulating layer, wherein a contact hole is defined in the interlayer dielectric layer; and
source and drain electrodes formed on the interlayer dielectric layer, wherein the source and drain electrodes are electrically connected to the active layer through the contact hole,
wherein the blocking layer is formed between and contacts the first substrate and the active layer.

6. A flat panel display device comprising:
a first substrate;
a second substrate disposed opposite to the first substrate;
a common electrode formed between the first and second substrates, wherein the common electrode is closer to the second substrate than the first substrate;
a liquid crystal layer formed between the first and second substrates;
a thin film transistor (TFT) formed between the first and second substrates, wherein the TFT comprises source and drain electrodes;
a blocking layer formed between the first substrate and the TFT, wherein the blocking layer is formed only beneath the TFT;
a planarization layer formed on the TFT, wherein a via hole is defined in the planarization layer; and
a pixel electrode formed on the planarization layer and electrically connected to the source or drain electrode of the TFT through the via hole,
wherein the TFT comprises:
an active layer formed on the blocking layer, wherein the active layer comprises source, drain and channel regions, and wherein the blocking layer is formed only beneath the active layer;
a gate insulating layer formed on the active layer;
a gate electrode formed on the gate insulating layer in the channel region;

an interlayer dielectric layer formed on the gate electrode and the gate insulating layer, wherein a contact hole is defined in the interlayer dielectric layer; and source and drain electrodes formed on the interlayer dielectric layer, wherein the source and drain electrodes are electrically connected to the active layer through the contact hole, wherein the blocking layer is formed between and contacts the first substrate and the active layer, wherein the blocking layer has a first width defined along a first direction, and wherein the active layer has a second width defined along the first direction, and wherein the first width and the second width are substantially the same.

7. A flat panel display device comprising:

a substrate, wherein a pixel region and an element forming region are formed in or over the substrate, and wherein the pixel region is configured to emit light;

a thin film transistor (TFT) formed over the substrate, wherein the TFT comprises source and drain electrodes;

a first blocking layer formed between the substrate and the TFT, wherein the first blocking layer is not formed in the pixel region, wherein the first blocking layer comprises a silicon oxide layer and a silicon nitride layer formed on the silicon oxide layer, and wherein the silicon oxide layer is closer to the substrate than the silicon nitride layer;

a planarization layer formed on the TFT, wherein a via hole is defined in the planarization layer; a pixel electrode formed on the planarization layer and electrically connected to the source or drain electrode of the TFT through the via hole;

an organic light emitting layer formed on the pixel electrode; and a cathode electrode formed on the organic light emitting layer.

8. The flat panel display device according to claim 7, wherein the TFT comprises:

an active layer formed on the first blocking layer, wherein the active layer comprises source, drain and channel regions and wherein the first blocking layer is formed only beneath the active layer;

a gate insulating layer formed on the active layer;

a gate electrode formed on the gate insulating layer in the channel region;

an interlayer dielectric layer formed on the gate electrode and gate insulating layer, wherein a contact hole is defined in the interlayer dielectric layer; and source and drain electrodes formed on the interlayer dielectric layer and electrically connected to the active layer in the source and drain regions through the contact hole.

9. The flat panel display device according to claim 8, wherein the first blocking layer is formed between the substrate and the active layer, wherein the first blocking layer has a first width defined along a first direction, wherein the active layer has a second width defined along the first direction, and wherein the first width and the second width are substantially the same.

10. The flat panel display device according to claim 8, further comprising:

a capacitor formed between the substrate and the interlayer dielectric layer, wherein the capacitor is formed adjacent to the TFT, and wherein the capacitor comprises a lower electrode and an upper electrode; and a second blocking layer formed between and contacting the substrate and the lower electrode of the capacitor, wherein the second blocking layer is formed only beneath the lower electrode of the capacitor.

11. The flat panel display device according to claim 10, wherein the second blocking layer comprises a silicon oxide layer and a silicon nitride layer formed on the silicon oxide layer, and wherein the silicon oxide layer is closer to the substrate than the silicon nitride layer.

12. A method of manufacturing a flat panel display device, comprising:

providing a substrate, wherein a pixel region and an element forming region are formed in and over the substrate;

forming at least one blocking layer in the element forming region of the substrate, wherein the at least one blocking layer comprises a plurality of blocking layers which are separated from each other and are not formed in the pixel region;

forming an active layer on the blocking layer in the element forming region;

removing portions of the active layer and the at least one blocking layer so that the blocking layer is disposed only beneath the active layer;

forming a gate insulating layer on the substrate and the active layer;

forming a gate electrode on the gate insulating layer;

forming an interlayer dielectric layer on the gate insulating layer and the gate electrode;

exposing a portion of the active layer;

forming source and drain electrodes on the interlayer dielectric layer so as to be electrically connected to the exposed portion of the active layer;

forming a planarization layer on i) the interlayer dielectric layer and ii) the source and drain electrodes; exposing the source or drain electrode; and forming a pixel electrode on the planarization layer so as to be electrically connected to the exposed portion of the source or drain electrode.

13. The method according to claim 12, wherein forming the at least one blocking layer comprises:

forming a silicon oxide layer on the substrate; and forming a silicon nitride layer on the silicon oxide layer, wherein the silicon oxide layer and the silicon nitride layer have substantially the same width.

14. The method according to claim 12, wherein the removing of the blocking layer is performed by dry etching.

15. The method according to claim 14, wherein the dry etching is an inductively coupled plasma etching.

16. The method according to claim 12, further comprising:

forming a pixel defining layer on the planarization layer and the pixel electrode;

patterning the pixel defining layer to expose the pixel electrode in a light emitting region;

forming an organic light emitting layer on the exposed pixel electrode; and forming a cathode electrode on the organic light emitting layer.

* * * * *